(12) United States Patent
Lee et al.

(10) Patent No.: US 8,697,455 B2
(45) Date of Patent: Apr. 15, 2014

(54) MONITORING TEST ELEMENT GROUPS (TEGS) FOR ETCHING PROCESS AND METHODS OF MANUFACTURING A SEMICONDUCTOR DEVICE USING THE SAME

(75) Inventors: Kyoung-Woo Lee, Hwaseong-si (KR); Hong-Jae Shin, Seoul (KR); Woo-Jin Jang, Seoul (KR)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 150 days.

(21) Appl. No.: 13/415,270

(22) Filed: Mar. 8, 2012

(65) Prior Publication Data

US 2012/0231564 A1 Sep. 13, 2012

(30) Foreign Application Priority Data

Mar. 9, 2011 (KR) ................. 10-2011-0021009

(51) Int. Cl.
*H01L 21/66* (2006.01)
(52) U.S. Cl.
USPC ........... 438/16; 438/17; 438/622; 438/637; 438/735; 438/736; 438/737; 438/738; 438/740
(58) Field of Classification Search
USPC ............ 438/16, 17, 622, 637, 735–738, 740
See application file for complete search history.

(56) References Cited

U.S. PATENT DOCUMENTS

| | | | | |
|---|---|---|---|---|
| 6,605,861 B2* | 8/2003 | Toyoda | ......... | 257/620 |
| 6,686,270 B1 | 2/2004 | Subramanian et al. | | |
| 2003/0034558 A1* | 2/2003 | Umemura et al. | ......... | 257/734 |
| 2005/0183282 A1* | 8/2005 | Watanabe et al. | ......... | 33/836 |
| 2007/0184565 A1* | 8/2007 | Park et al. | ......... | 438/14 |

FOREIGN PATENT DOCUMENTS

| | | |
|---|---|---|
| KR | 1997-0013155 | 3/1997 |
| KR | 0172047 | 3/1999 |

OTHER PUBLICATIONS

English Abstract for Publication No. 1997-0013155.
English Abstract for Publication No. 0172047.

* cited by examiner

*Primary Examiner* — Bac Au
(74) *Attorney, Agent, or Firm* — F. Chau & Associates, LLC

(57) ABSTRACT

Disclosed is a monitoring TEG for an etching process in a semiconductor device. The TEG includes an etch stopping layer on a substrate and a target layer to be etched provided on the etch stopping layer. The target layer to be etched includes a first opening portion formed by etching a portion of the target layer to be etched and a second opening portion formed by etching another portion of the target layer to be etched. The second opening portion has a smaller depth than the first opening portion. A depth of a partial contact hole formed by a first partial etching process may be measured.

20 Claims, 17 Drawing Sheets

MONITORING TEST ELEMENT GROUPS (TEGS) FOR ETCHING PROCESS AND METHODS OF MANUFACTURING A SEMICONDUCTOR DEVICE USING THE SAME

CROSS-REFERENCE TO RELATED APPLICATIONS

This application claims priority under 35 USC §119 to Korean Patent Application No. 10-2011-0021009, filed on Mar. 9, 2011, the disclosure of which is hereby incorporated by reference herein in it's entirety.

BACKGROUND

1. Technical Field

Example embodiments relate to monitoring TEGs for an etching process and methods of manufacturing a semiconductor device using the same. More particularly, example embodiments relate to monitoring TEGs for an etching process for accurately measuring a depth of a contact hole formed while performing a partial etching process for forming a metal wiring and methods of manufacturing a semiconductor device using the same.

2. Description of the Related Art

To form a metal contact and a wiring line in a semiconductor device, a contact hole and a trench may be formed in advance. In addition, a depth of the contact hole etched may be required to be measured accurately. However, confirmation of the contact hole etched having an accurate depth while performing the forming process of a contact hole and a trench may not be an easy task. For example, when an insulating interlayer is not etched to an etch stopping layer at one time but is partially etched to form a partial via contact hole first while forming a contact hole, the measuring of a depth of the etched partial via contact hole may be a difficult task. Accordingly, a test elements group (TEG) for accurately measuring the etched depth of the partial via contact hole and a method of measuring the etched depth may be required.

SUMMARY

Example embodiments provide a monitoring TEG for an etching process.

Example embodiments provide a method of manufacturing a semiconductor device using the TEG.

According to an example embodiment, there is provided a monitoring test elements group (TEG) for an etching process in a semiconductor device. The monitoring TEG includes an etch stopping layer on a substrate and a target layer to be etched provided on the etch stopping layer. The target layer to be etched includes a first opening portion formed by etching a portion of the target layer to be etched and a second opening portion formed by etching another portion of the target layer to be etched. The second opening portion has a smaller depth than the first opening portion.

In example embodiments, the TEG may further include a first metal pattern facing a bottom portion of the first opening portion. The first metal pattern may be separated apart from the bottom portion of the first opening portion. The TEG may also further include a second metal pattern facing a bottom portion of the second opening portion. The second metal pattern may be separated apart from the bottom portion of the second opening portion.

In example embodiments, the first opening portion may be formed through a first partial etching process, a second main etching process and a third etching process with respect to the etch stopping layer, and the second opening may be formed through the second main etching process and the third etching process.

According to an example embodiment, there is provided a method of manufacturing a semiconductor device. In the method, an etch stopping layer and a target layer are formed on a substrate including a chip region and a scribe lane. A first hard mask pattern is formed on the target layer and a second hard mask pattern is formed on the first hard mask pattern. Then, a first partial etching process is performed with respect to the target layer using the second hard mask pattern, to form partial contact holes in the chip region and in the scribe lane, respectively. A second etching process is performed with respect to the target layer and a third etching process with respect to the etch stopping layer using the first hard mask pattern, to form a trench and a contact hole in the chip region and a first opening portion extending from the partial contact hole in the scribe lane and a second opening portion formed by etching the target layer near the partial contact hole in the scribe lane. A depth of the partial contact hole formed in the scribe lane by the first partial etching process is measured using a difference between a depth of the first opening portion and a depth of the second opening portion.

In example embodiments, the measuring of the depth of the partial contact hole in the scribe lane may be performed as follows. A first depth of the first opening portion may be measured and a second depth of the second opening portion may be measured. Then, a third depth of an etched portion by the second etching process and the third etching process in the first opening portion may be calculated by using the second depth of the second opening portion. The depth of the partial contact hole formed by the first partial etching process may be obtained using the first depth of the first opening portion and the third depth.

In example embodiments, the third depth may be calculated from a proportional relationship between the second depth and the third depth. The proportional relationship may be obtained through performing a plurality of experiments.

In example embodiments, the first depth and the second depth may be measured by a physical method using a probe.

In example embodiments, a first metal pattern may be further formed under the etch stopping layer. The first metal pattern may face a bottom portion of the first opening portion and the first metal pattern may be separated apart from the bottom portion of the first opening portion. A second metal pattern may be further formed under the etch stopping layer. The second metal pattern may face a bottom portion of the second opening portion and the second metal pattern may be separated apart from the bottom portion of the second opening portion.

In example embodiments, the measuring of the first depth may be performed as follows. A first distance from the bottom portion of the first opening portion to the first metal pattern may be measured using a reflecting light from the first metal pattern under the first opening portion. Then, the first depth may be calculated using a thickness from an upper surface portion of the first metal pattern to an upper surface portion of the target layer to be etched and the first distance.

In example embodiments, the measuring of the second depth may be performed as follows. A second distance from a bottom portion of the second opening portion to the second metal pattern may be measured using a reflecting light from the second metal pattern under the second opening portion. Then, the second depth may be calculated using a thickness from an upper surface portion of the second metal pattern to the upper surface portion of the target layer to be etched and the second distance.

In example embodiments, the first hard mask pattern may expose a portion of the target layer for forming a trench in the chip region and may expose portions of the target layer for forming the first and second opening portions in the scribe lane.

In example embodiments, the second hard mask pattern may expose a portion of the target layer for forming a contact hole in the chip region and may expose a portion of the target layer for forming the first opening portion in the scribe lane.

In example embodiments, the forming of the second hard mask pattern may include forming a second hard mask layer on the first hard mask pattern using a spin coating process. An etching mask pattern may be formed on the second hard mask layer. Then, the second hard mask layer may be etched using the etching mask pattern to form the second hard mask pattern.

In example embodiments, a metal layer may be further formed in the trench and the contact hole in the chip region and in the first and second opening portions in the scribe lane. Then, the metal layer may be polished to expose an upper surface portion of the target layer to be etched.

In example embodiments, the etch stopping layer may include at least one material selected from the group consisting of SiCN, SiON and SiN.

According to an example embodiment, a method of manufacturing a semiconductor device is provided. The method includes forming a first insulating interlayer on a substrate including a chip region and a scribe lane, forming a first etch stopping layer on the first insulating interlayer, forming a second insulating interlayer on the first etch stopping layer, forming a first opening portion in the second insulating interlayer in the scribe region by performing a first etching process which partially etches the second insulating interlayer to form a partial contact hole in the scribe region which does not expose the first etch stopping layer in the scribe region, a second etching process which etches the second insulating interlayer until the etch stopping layer is exposed in the scribe region and a third etching process which etches the first etch stopping layer exposed in the scribe region. The method further includes forming a second opening portion in the second insulating layer near the first opening portion in the scribe region by performing only the second and third etching processes and wherein the first etch stopping layer is not exposed by the second opening portion and measuring a depth of the partial contact hole formed by the first etching process using a depth of the first opening portion and a depth of the second opening portion.

According to an example embodiment, a method of manufacturing a semiconductor device is provided. The method includes forming a first insulating interlayer on a substrate including a chip region and a scribe lane, forming a first metal pattern in the first insulating interlayer in the chip region and a second metal pattern in the first insulating interlayer in the scribe lane, forming a second insulating interlayer on the first insulating interlayer, forming a third insulating interlayer on the second insulating interlayer, forming a third metal pattern in the third insulating interlayer in the chip region and a fourth metal pattern in the third insulating interlayer in the scribe lane, forming a first etch stopping layer on the third insulating interlayer and a fourth insulating interlayer on the first etch stopping layer, and forming a first hard mask pattern on the fourth insulating interlayer and a second mask pattern on the first hard mask pattern.

The method further includes performing a first etching process which includes etching the fourth insulating interlayer to form a partial contact hole in the chip region and in the scribe lane facing the second metal pattern formed in the scribe region using the second hard mask pattern, such that the first etch stopping layer is not exposed by the partial contact holes in the chip region and the scribe lane, performing a second etching process using the first hard mask pattern which includes etching the fourth insulating interlayer including a bottom portion of the partial contact hole in the chip region to form a preliminary first contact hole exposing the first etch stopping layer in the chip region and a preliminary first trench connected to the preliminary first contact hole in the chip region, and etching the fourth insulating interlayer including a bottom portion of the partial contact hole in the scribe region and another portion of the fourth insulating interlayer near the partial contact hole in the scribe region to respectively form a preliminary first opening portion in the scribe region exposing the first etch stopping layer and a preliminary second opening portion in the scribe lane which does not expose the first etch stopping layer and which faces the fourth metal pattern formed in the scribe region.

In addition, the method further includes performing a third etching process using the first hard mask pattern which includes etching the fourth insulating interlayer and the first etch stopping layer exposed by the preliminary first contact hole to form a first contact hole in the chip region exposing the third metal pattern and a first trench connected with the first contact hole, etching a portion of the first etch stopping layer exposed by the preliminary first opening portion in the scribe lane to form a first opening portion in the scribe lane and etching the fourth insulating interlayer at a bottom of the preliminary second opening portion in the scribe lane to form a second opening portion in the scribe lane having a depth less a depth of the fourth insulating interlayer and less than a depth of the first opening portion and measuring a depth of the partial contact hole formed in the scribe lane by the first etching process using a difference between the depth of the first opening portion and the depth of the second opening portion formed in the scribe region.

In example embodiments, a depth of a partial via contact hole may be accurately measured using a TEG in accordance with the present inventive concept. Using the measured depth of the partial via contact hole, the partial via contact hole may be evaluated if formed normally. Accordingly, process defects generated due to formation of an abnormal partial via contact hole may be prevented.

BRIEF DESCRIPTION OF THE DRAWINGS

Example embodiments can be more clearly understood from the following detailed description taken in conjunction with the accompanying drawings.

FIG. 1 is a cross-sectional view illustrating a monitoring TEG for an etching process in accordance with an example embodiment of the present inventive concept.

FIGS. 2 to 6 are cross-sectional views for explaining a method of forming a monitoring TEG for the etching process illustrated in FIG. 1 in accordance with an example embodiment of the present inventive concept.

FIGS. 7 to 15 are cross-sectional views for explaining a method of forming a metal wiring while manufacturing a semiconductor device in accordance with an example embodiment of the present inventive concept.

FIG. 16 is a cross-sectional view of a structure illustrating a partial contact hole undergoing under-etching.

FIG. 17 is a cross-sectional view of another structure illustrating a partial contact hole undergoing over-etching.

FIG. 18 is a cross-sectional view illustrating a monitoring TEG for an etching process in accordance with an example embodiment of the present inventive concept.

DETAILED DESCRIPTION OF EXAMPLE EMBODIMENTS

Figure 1:
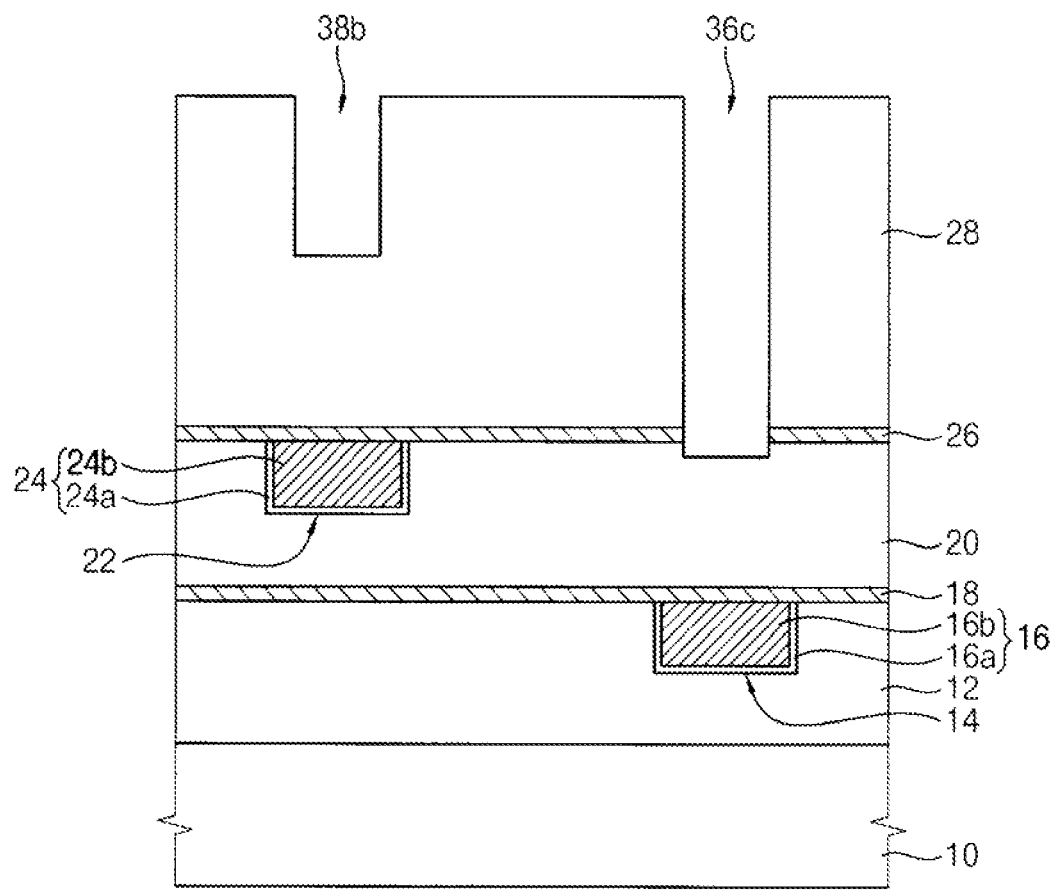
FIGS. 1 to 18 represent non-limiting, example embodiments as described herein.

Various example embodiments will be described more fully hereinafter with reference to the accompanying drawings, in which some example embodiments are shown. Example embodiments of the present inventive concept may, however, be embodied in many different forms and should not be construed as limited to example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. Like numerals refer to like elements throughout. As used herein, the term "and/or" includes any and all combinations of one or more of the associated listed items.

Hereinafter, example embodiments on monitoring TEGs for an etching process and methods of manufacturing a semiconductor device using the same will be explained in detail.

FIG. 1 is a cross-sectional view illustrating a monitoring TEG for an etching process in accordance with an example embodiment of the present inventive concept.

The monitoring TEG for an etching process in accordance with the example embodiment illustrated in FIG. 1 may be formed to measure a depth of a partial contact hole formed by performing a partial etching process.

Referring to FIG. 1, a substrate 10 including, for example, a chip region and a scribe lane may be provided. A monitoring TEG for an etching process in an example embodiment may be provided in the scribe lane of the substrate. The scribe lane may be provided between chips on a wafer for cutting. A portion of the substrate 10 including only the scribe lane may be illustrated in FIG. 1.

On the substrate 10, a first insulating interlayer 12 may be formed. At an upper portion of the first insulating interlayer 12, a first trench 14 may be provided.

Within the first trench 14, a first metal pattern 16 may be provided. The first metal pattern 16 may include, for example, copper. For example, the first metal pattern 16 may include a first barrier metal layer pattern 16a provided along a sidewall and a bottom portion of the first trench 14 and a first copper pattern 16b provided on the first barrier metal layer pattern 16a.

A first etch stopping layer 18 covering the first insulating interlayer 12 and the first metal pattern 16 may be provided. The first etch stopping layer 18 may include at least one of, for example, silicon carbon nitride (SiCN), silicon oxynitride (SiON), silicon nitride (SiN), etc.

A second insulating interlayer 20 may be provided on the first etch stopping layer 18. At an upper portion of the second insulating interlayer 20, a second trench 22 may be provided. The second trench 22 may be formed so as not to face the first metal pattern 16. That is, the second trench 22 may not be provided at a vertical direction of an upper surface portion of the first metal pattern 16.

Within the second trench 22, a second metal pattern 24 may be provided. The second metal pattern 24 may be formed using the same material as the first metal pattern 16. That is, the second metal pattern 24 may include, for example, copper. For example, the second metal pattern 24 may include a second barrier metal layer pattern 24a formed along a sidewall and a bottom portion of the second trench 22 and a second copper pattern 24b provided on the second barrier metal layer pattern 24a.

A second etch stopping layer 26 covering the second insulating interlayer 20 and the second metal pattern 24 may be provided. The second etch stopping layer 26 may include, for example, at least one material of SiCN, SiON, SiN, etc.

On the second etch stopping layer 26, a third insulating interlayer 28 may be provided.

At the third insulating interlayer 28, a first opening portion 36c along a direction perpendicular to an upper surface portion of the first metal pattern 16 may be formed. That is, a bottom surface portion of the first opening portion 36c may face the upper surface portion of the first metal pattern 16. The first opening portion 36c may be formed by, for example, performing a first etching process for partially etching the third insulating interlayer 28, a second etching process which may correspond to a main etching process and a third etching process for etching the second etch stopping layer 26.

Through performing the first etching process, the third insulating interlayer 28 may be etched to a thickness not exposing the second etch stopping layer 26. Through the main etching process, the second etch stopping layer 26 may be exposed. Accordingly, the first opening portion 36c may extend from an upper surface portion of the third insulating interlayer 28 to the upper surface portion of the second insulating interlayer 20 underlying the second etch stopping layer 26. The bottom surface portion of the first opening portion 36c may be positioned at the second insulating interlayer 20.

The first metal pattern 16 provided under the first opening portion 36c may be used to measure a depth of the first opening portion 36c by, for example, an optical method. That is, a distance from the bottom surface portion of the first opening portion 36c to the upper surface portion of the first metal pattern 16 may be measured using, for example, a reflecting light from the upper surface portion of the first metal pattern 16. In addition, the depth of the first opening portion 36c may be measured using the measured distance obtained from measuring the bottom surface portion of the first opening portion 36c to the upper surface portion of the first metal pattern 16. Accordingly, no other metal pattern but only the first metal pattern 16 should be provided under the first opening portion 36c.

At the third insulating interlayer 28, a second opening portion 38b extending along a vertical direction with respect to the upper surface portion of the second metal pattern 24 may be provided. That is, a bottom surface portion of the second opening portion 38b may be provided to face the upper surface portion of the second metal pattern 24. The second opening portion 38b may be formed by performing, for example, the second etching process, e.g. the main etching process and the third etching process excluding the first etching process. The second etch stopping layer 26 may not be exposed through the bottom surface portion of the second opening portion 38b formed by the second etching process and the third etching process. Accordingly, the bottom surface portion of the second opening portion 38b may be positioned at the third insulating interlayer 28.

The second metal pattern 24 provided under the second opening portion 38b may be used to measure a depth of the second opening portion 38b by, for example, an optical method. That is, a distance from the bottom surface portion of the second opening portion 36b to the upper surface portion of the second metal pattern 24 may be measured using, for example, a reflecting light from the upper surface portion of the second metal pattern 24. In addition, a depth of the second opening portion 38b may be measured using the measured distance obtained from measuring the bottom surface portion of the second opening portion 36b to the upper surface portion of the second metal pattern 24. Accordingly, no other metal patterns but only the second metal pattern 24 should be provided under the second opening portion 38b.

The above described TEG may be formed to measure the depth of the partial contact hole formed through, for example, the first etching process. That is, by using a distance difference between the first opening portion 36c and the second opening portion 38b, the depth of the partial contact hole formed by the first etching process may be obtained.

FIGS. 2 to 6 are cross-sectional views for explaining a method of forming a monitoring TEG for the etching process illustrated in FIG. 1 in accordance with an example embodiment of the present inventive concept.

Figure 2:
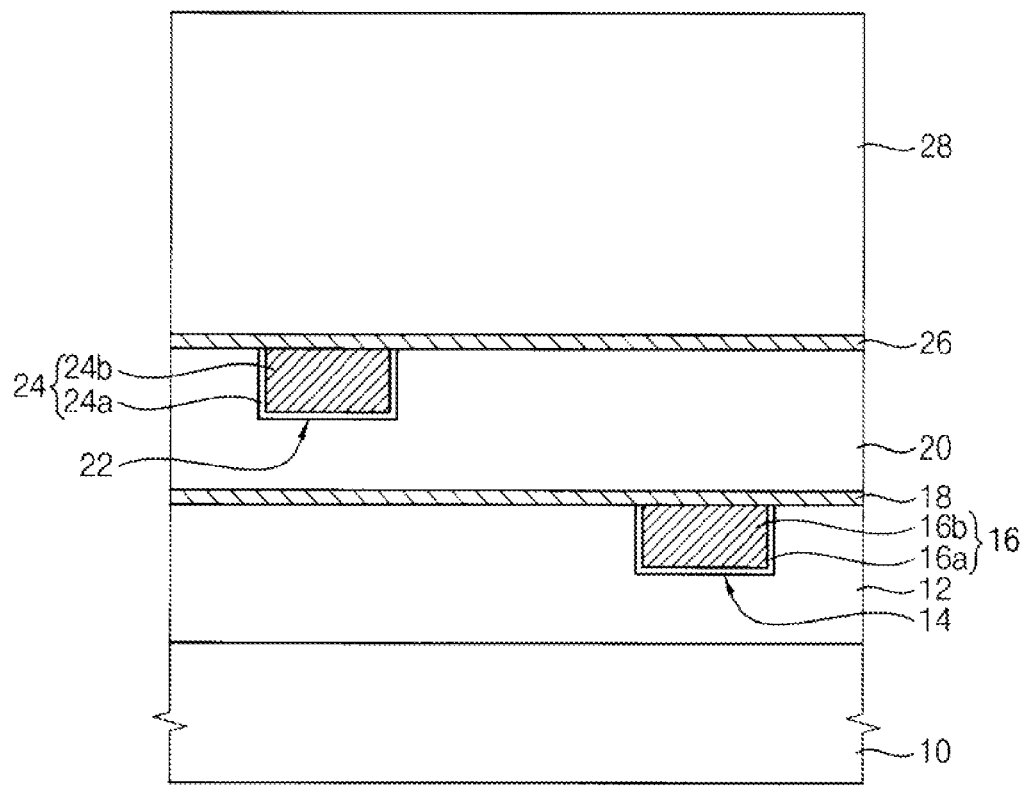

Referring to FIG. 2, a substrate including, for example, a chip region and a scribe lane may be provided. The monitoring TEG in accordance with example embodiments may be formed at the scribe lane of the substrate 10.

A first insulating interlayer 12 may be formed on the substrate 10. The first insulating interlayer 12 may be partially etched to form a first trench 14. Within the first trench 14, a first metal pattern 16 may be formed. To form the first metal pattern 16, a first barrier metal layer 16a may be formed along a sidewall and a bottom portion of the first trench 14 and along an upper surface portion of the first insulating interlayer 12. On, for example, the first barrier metal layer 16a, a copper layer 16b may be formed by an electroplating method. Then, the copper layer 16b may be polished to expose the upper surface portion of the first insulating interlayer 12.

A first etch stopping layer 18 covering the first insulating interlayer 12 and the first metal pattern 16 may be formed. The first etch stopping layer 18 may include, for example, at least one material of SiCN, SiON and SiN.

A second insulating interlayer 20 may be formed on the first etch stopping layer 18. The second insulating interlayer 20 may be partially etched to form a second trench 22. The second trench 22 may be formed so as not to face an upper surface portion of the first metal pattern 16. That is, the second trench 22 may not be provided at a vertical direction of the upper surface portion of the first metal pattern 16.

Within the second trench 22, a second metal pattern 24 may be formed. To form the second metal pattern 24, a second barrier metal layer 24a may be formed along a sidewall and a bottom portion of the second trench 22 and along an upper surface portion of the second insulating interlayer 20. On, for example, the second barrier metal layer 24a, a copper layer 24b may be formed by an electroplating method. Then, the copper layer 24b may be polished to expose the upper surface portion of the second insulating interlayer 20.

A second etch stopping layer 26 covering the second insulating interlayer 20 and the second metal pattern 24 may be formed. The second etch stopping layer 26 may include, for example, at least one material of SiCN, SiON and SiN.

A third insulating interlayer 28 may be formed on the second etch stopping layer 26.

Figure 3:
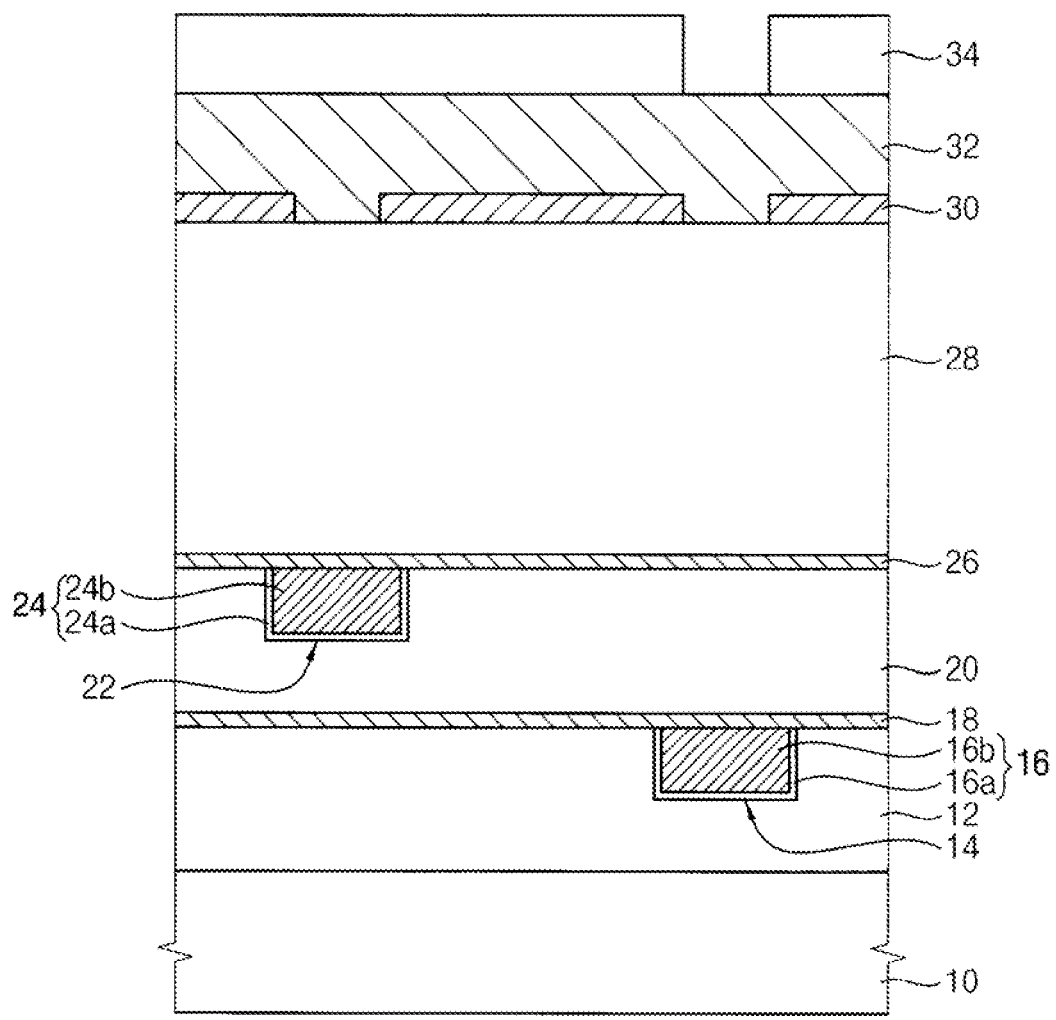

Referring to FIG. 3, a first hard mask pattern 30 may be formed on the third insulating interlayer 28. The first hard mask pattern 30 may have a shape exposing portions for forming a first opening portion and a second opening portion, respectively. For example, the first hard mask pattern 30 may have a shape exposing a portion of a facing portion with upper surface portions of the first and second metal patterns 16 and 24.

A second hard mask layer 32 may be formed on the first hard mask pattern 30. The second hard mask layer 32 may be formed by, for example, a spin coating process. The second hard mask layer 32 may be formed using a material that may be easily removed by an ashing process. The second hard mask layer 32 may have, for example, a planar upper surface portion.

An etching mask pattern 34 exposing a portion of the third insulating interlayer 28 to be partially etched may be formed on the second hard mask layer 32. That is, the etching mask pattern 34 may have a shape exposing a portion of a facing portion with respect to the upper surface portion of the first metal pattern 16. The etching mask pattern 34 may be, for example, a photoresist pattern formed by coating a photoresist and then patterning by means of photolithography.

Figure 4:
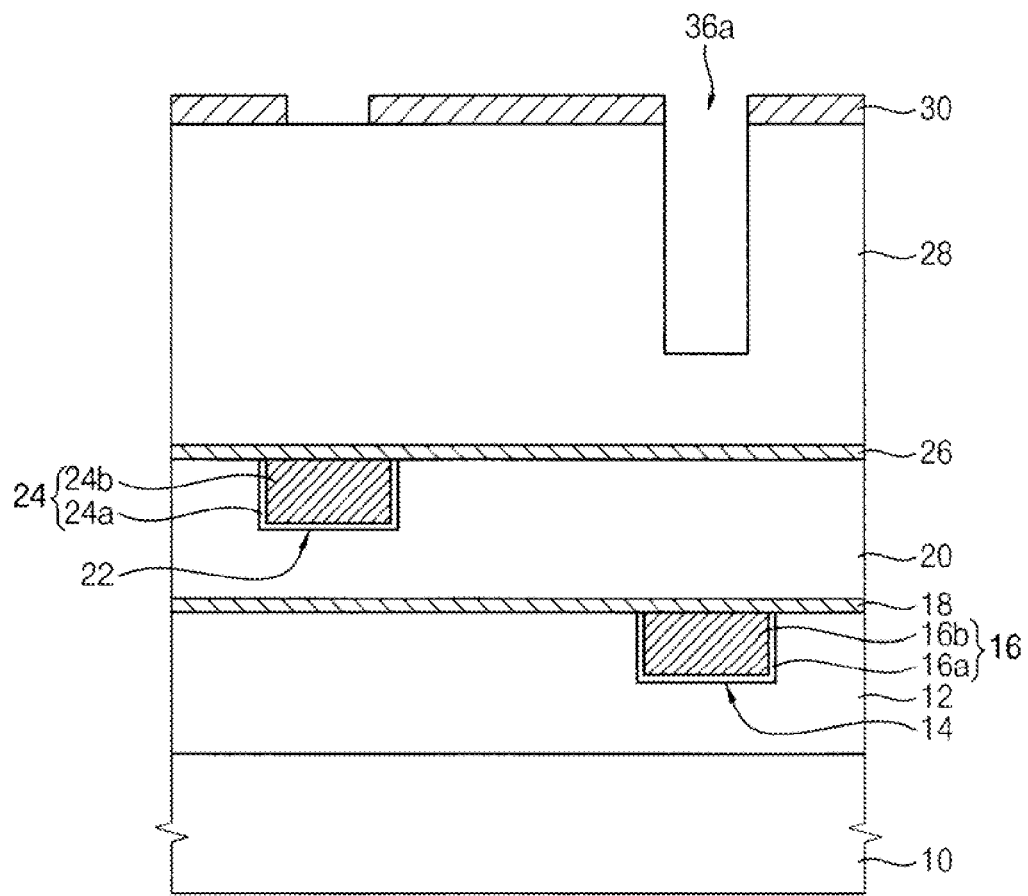

Referring to FIG. 4, the second hard mask layer 32 may be etched using the etching mask pattern 34 to form a second hard mask pattern (not illustrated).

The third insulating interlayer 28 may be partially etched using the second hard mask pattern to perform a first etching process. After completing the first etching process, a partial contact hole 36a may be formed.

Then, the second hard mask pattern may be removed. The second hard mask pattern may be removed by, for example, a plasma ashing process.

Figure 5:
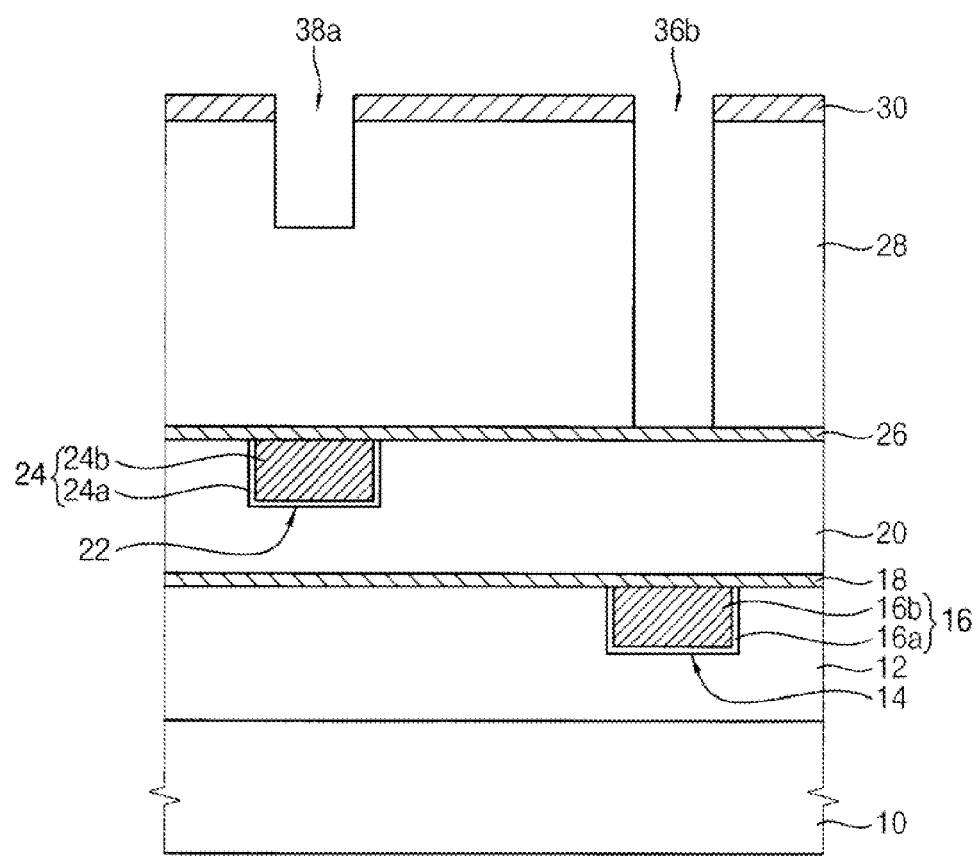

Referring to FIG. 5, the third insulating interlayer 28 may be secondly etched using the first hard mask pattern 30. The second etching process may be performed to etch the third insulating interlayer 28 at the bottom portion of the contact hole 36a until the second etch stopping layer 26 may be exposed. After completing the second etching process, a preliminary first opening portion 36b and a preliminary second opening portion 38a may be formed, respectively.

Referring to FIG. 5 again, the second etching process with respect to the third insulating interlayer 28 at the bottom portion of the partial contact hole 36a may be stopped at the second etch stopping layer 26. However, at the bottom portion of the preliminary second opening portion 38a, the second etch stopping layer 26 may not be exposed. Accordingly, the third insulating interlayer 28 may be continuously etched to some degree while performing the second etching process near the second etch stopping layer 26. Therefore, a depth of the preliminary second opening portion 38a may be different from a difference between a depth of the preliminary first opening portion 36b and a depth of the partial contact hole 36a. However, as the depth of the preliminary second opening portion 38a becomes greater, the difference of the depth of the preliminary first opening portion 36b and the depth of the partial contact hole 36a may also become greater.

Figure 6:
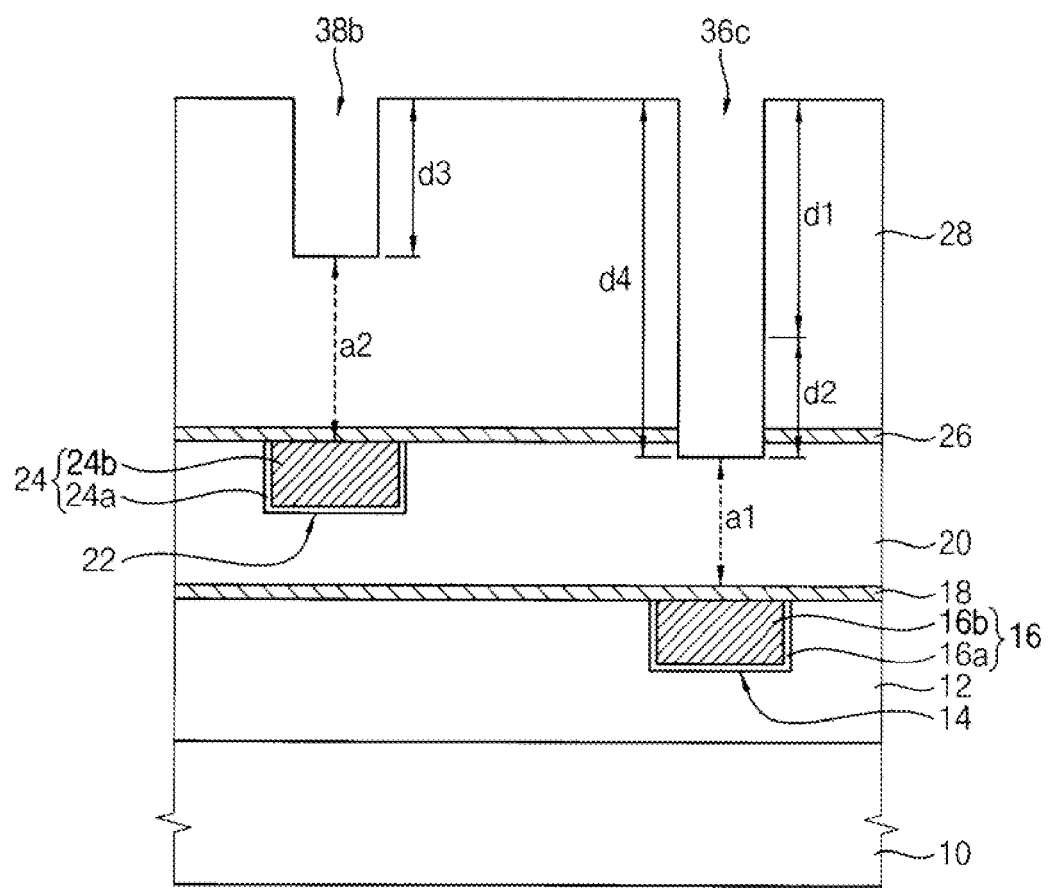

Referring to FIG. 6, a third etching process may be performed to remove the second etch stopping layer 26 exposed through the bottom portion of the preliminary first opening portion 36b. Then, a TEG including the first and second opening portions 36c and 38b may be obtained.

After completing the third etching process, the second etch stopping layer 26 may be removed and the second insulating interlayer 20 under the second etch stopping layer 26 may be also partially removed. In addition, the third insulating interlayer 28 underlying the preliminary second opening portion 38a may be etched at the same time. However, a thickness etched of the second etch stopping layer 26 and a thickness etched of the third insulating interlayer 28 may not be the same because the second etch stopping layer 26 and the third insulating interlayer 28 may be formed using different materials.

As the depth of the second opening portion 38b by the third etching process becomes greater, the difference between the depth of the first opening portion 36c and the depth of the partial contact hole 36a may become greater. That is, the depth of the second opening portion 38b may be proportional to the difference between the depth of the first opening portion 36c and the depth of the partial contact hole 36a.

In the completed TEG, the depth of the partial contact hole 36a may be measured using the proportional relationship between the depth of the second opening portion 38b and the difference between the depth of the first opening portion 36c and the depth of the partial contact hole 36a illustrated in FIG. 4.

The first to third etching processes may be performed, for example, in one processing equipment in-situ. Accordingly, the measuring of the depth of the partial contact hole formed by the first etching process may be difficult. Accordingly, the depth of the partial contact hole 36a formed by the first etching process may be measured or computed after completing the third etching process. As described above, the depth of the partial contact hole 36a formed after performing the first etching process may be obtained using the completed TEG.

Hereinafter, a method of measuring a depth of a partial contact hole using a monitoring TEG for an etching process illustrated in FIG. 1 may be explained in detail.

The depths of the first and second opening portions 36c and 38b may be measured using the TEG illustrated in FIGS. 1 and 6. The depth of the first and second opening portions 36c and 38b may be measured by, for example, an optical method.

For example, a light may be applied under the first opening portion 36c to pass the second insulting interlayer 20 under the first opening portion 36c. A first distance a1 from the bottom portion of the first opening 36c to the first metal pattern 16 may be measured using, for example, a reflecting light from the first metal pattern 16. A fourth depth d4 of the first opening portion 36c may be measured using the first distance a1. In the same way, a light may be applied under the second opening portion 38b to pass the second insulating interlayer 20 under the second opening portion 38b. A second distance a2 from the bottom portion of the second opening portion 38b to the second metal pattern 24 may be measured using, for example, a reflecting light from the second metal pattern 24. A third depth d3 of the second opening portion 38b may be measured using the second distance a2.

The first opening portion 36c may be formed by performing, for example, the first, second and third etching processes. The fourth depth d4 of the first opening portion 36c may be obtained by adding a first depth d1 of the partial contact hole formed through performing the first etching process and a second depth d2 obtained through performing the second and third etching processes.

The second opening portion 38b may be formed by, for example, performing the second and third etching processes. The second opening portion 38b may be positioned at an etching target layer near the first opening portion 36c. The depth of the second opening portion 38b may be the third depth d3.

As described above, the second depth d2 may be proportional to the third depth d3. The proportional relationship between the second depth d2 and the third depth d3 may be accurately evaluated through data obtained a plurality of repeated experiments. For example, a proportional equation may be evaluated as $d3 = k \times d2$. Here, k represents a proportional constant. In this case, the second depth d2 may be calculated by measuring the third depth d3.

The first depth d1 of the partial contact hole may be obtained by subtracting the second depth d2 from the fourth depth d4 of the first opening portion 36c.

The TEG may be used to obtain the depth of the partial contact hole while completing the forming process of the contact hole, the trench, and so on through an etching process after forming the partial contact hole through a partial etching. A measuring method of the depth of the partial contact hole using the TEG while forming a metal wiring may be explained hereinafter.

FIGS. 7 to 15 are cross-sectional views for explaining a method of forming a metal wiring in a method of manufacturing a semiconductor device in accordance with an example embodiment.

Figure 7:
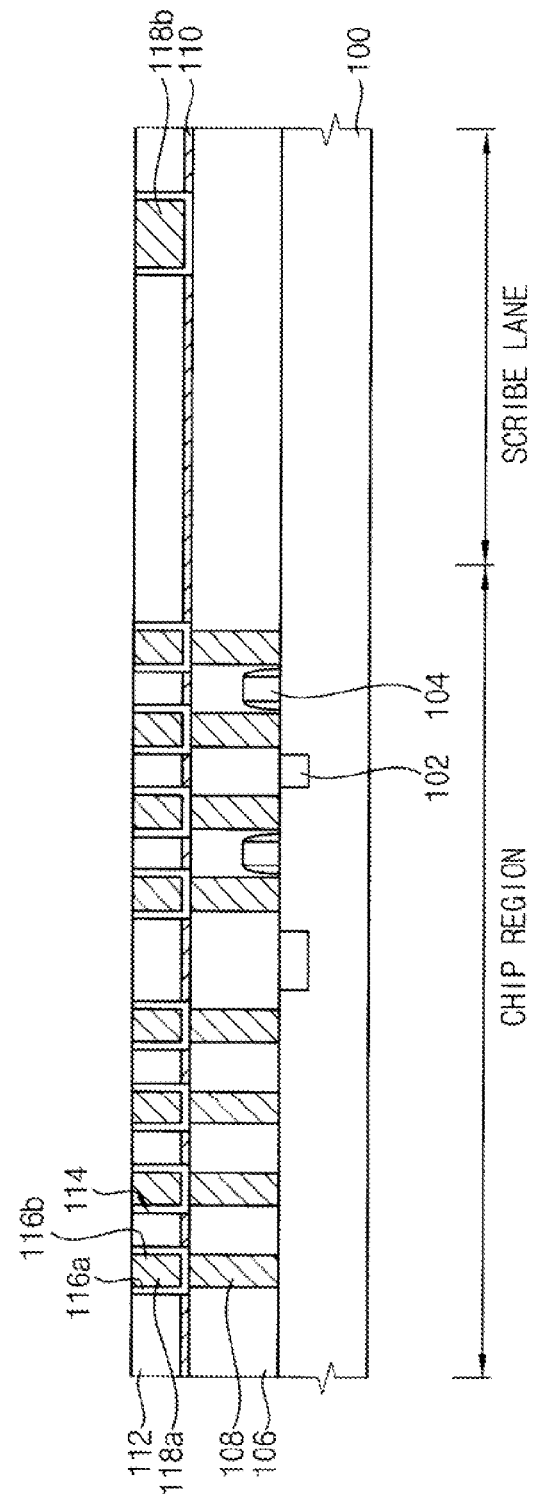

Referring to FIG. 7, a substrate 100 including, for example, a chip region and a scribe lane may be provided. A shallow trench isolation (STI) process may be performed, for example, with respect to the chip region of the substrate 100 to form a device isolation layer pattern 102. In addition, unit devices including a transistor 104 may be formed in the chip region of the substrate 100.

A first insulating interlayer 106 covering the unit devices may be formed on the substrate 100. The first insulating interlayer 106 may be formed using, for example, silicon oxide. The first insulating interlayer 106 may be partially etched to form first contact holes. Then, a conductive material may be deposited to fill up the first contact holes and, for example, a chemical mechanical polishing may be performed to expose an upper surface portion of the first insulating interlayer 106 and to form first contact plugs 108.

A first etch stopping layer 110 covering the first contact plugs 108 may be formed. A second insulating interlayer 112 may be formed on the first etch stopping layer 110. The second insulating interlayer 112 and the first etch stopping layer 110 may be partially etched to form first trenches 114 in the chip region and the scribe lane, respectively. Through a bottom portion of the first trench 114 in the chip region, a portion of an upper surface portion of the first contact plug 108 may be exposed.

A first barrier metal layer 116a may be formed on the surface portion of the first trench 114. The first barrier metal layer 116a may include, for example, titanium/titanium nitride. A first metal layer 116b may be formed on the first barrier metal layer 116a. For example, the first metal layer 116b may be formed by plating copper. The first metal layer 116b and the first barrier metal layer 116a may be polished to expose the second insulating interlayer 112 to form a first metal pattern 118a and a second metal pattern 118b.

Figure 8:
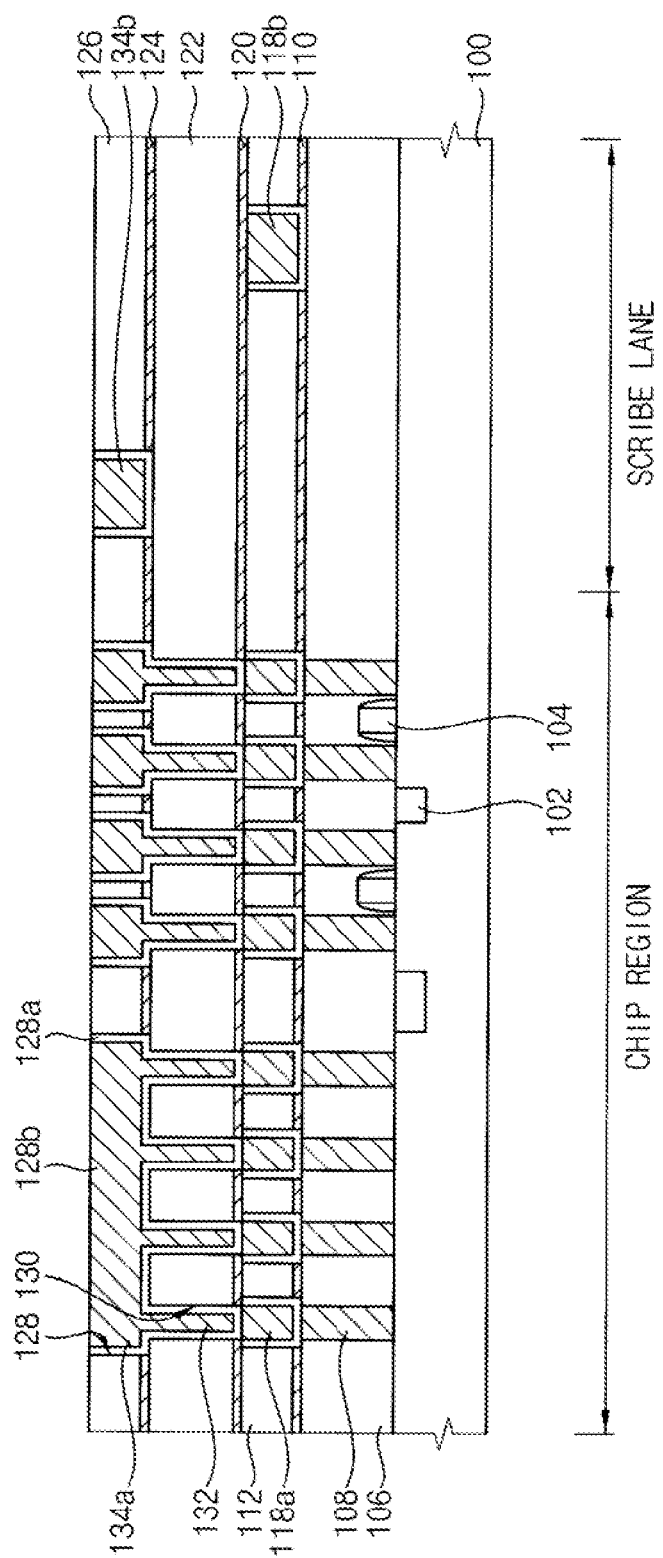

Referring to FIG. 8, a second etch stopping layer 120 and a third insulating interlayer 122 may be formed on the first and second metal patterns 118a and 118b and the second insulating interlayer 112. Then, a third etch stopping layer 124 and a fourth insulating interlayer 126 may be formed on the third insulating interlayer 122.

The fourth insulating interlayer 126 and the third etch stopping layer 124 may be partially etched to form second trenches 128 in the chip region and the scribe lane, respectively. The second trench 128 formed in the scribe lane may be provided, for example, so as not to face the second metal pattern 118b formed in the scribe lane. That is, the second trench 128 formed in the scribe lane may not be provided at a vertical direction of an upper surface portion of the second metal pattern 118b formed in the scribe lane.

The third insulating interlayer 122 and the second etch stopping layer 120 under the bottom portion of the second trench 128 formed in the chip region may be partially etched to form second contact holes 130 exposing an upper surface portion of the first metal pattern 118a in the chip region.

A second barrier metal layer 128a may be formed on the surface portion of the second trenches 128 and the second contact holes 130. The second barrier metal layer 128a may include, for example, titanium/titanium nitride. On the second barrier metal layer 128a, a second metal layer 128b may be formed. The second metal layer 128b may be formed by, for example, plating copper. The second metal layer 128b and the second barrier metal layer 128a may be polished to expose the fourth insulating interlayer 126 and to form a third metal pattern 134a and a fourth metal pattern 134b and a second contact plug 132.

In the scribe lane, the second contact plug 132 may not be formed. In addition, the fourth metal pattern 134b formed in the scribe lane may be formed, for example, so as not to face the second metal pattern 118b in the scribe lane.

The third and fourth metal patterns 134a and 134b and the second contact plug 132 may be formed through a dual damascene process as described above. Alternatively, the second contact plug 132 and the third and fourth metal patterns 134a and 134b may be formed by a single damascene process.

Figure 9:
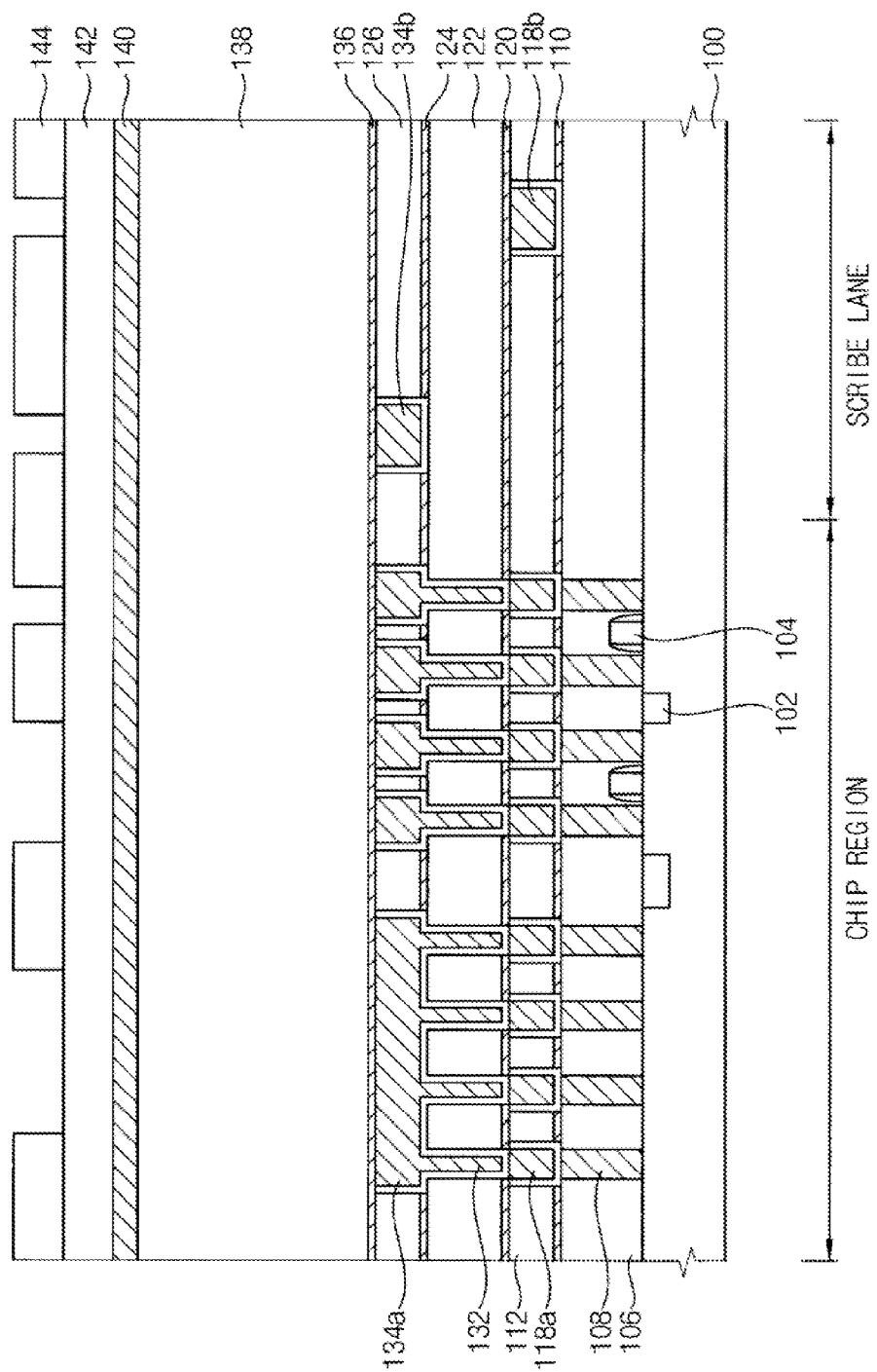

Referring to FIG. 9, a third etch stopping layer 136 and a fifth insulating interlayer 138 may be formed on the fourth insulating interlayer 126 and the third and fourth metal patterns 134a and 134b. At the fifth insulating interlayer 138, a metal wiring including, for example, copper may be formed in a following process. The fifth insulating interlayer 138 may be formed using, for example, an insulating material having a small dielectricity to decrease a generating ratio of a parasitic capacitance between the metal wirings.

A first hard mask layer 140 may be formed on the fifth insulating interlayer 138. The first hard mask layer 140 may include a metal material such as, for example, titanium nitride. Alternatively, the first hard mask layer 140 may be formed using, for example, silicon nitride.

On the first hard mask layer 140, a bottom anti-refection coating 142 may be formed. A first photoresist pattern 144 may be formed on the bottom anti-refection coating 142. The first photoresist pattern 144 may be an etching mask for patterning the first hard mask layer 140. The first photoresist pattern 144 provided in the chip region may be formed to selectively expose a portion for forming a third trench. The first photoresist pattern 144 provided in the scribe lane may be formed to selectively expose a facing portion with respect to the second metal pattern 118b and the fourth metal pattern 134b, respectively.

Figure 10:
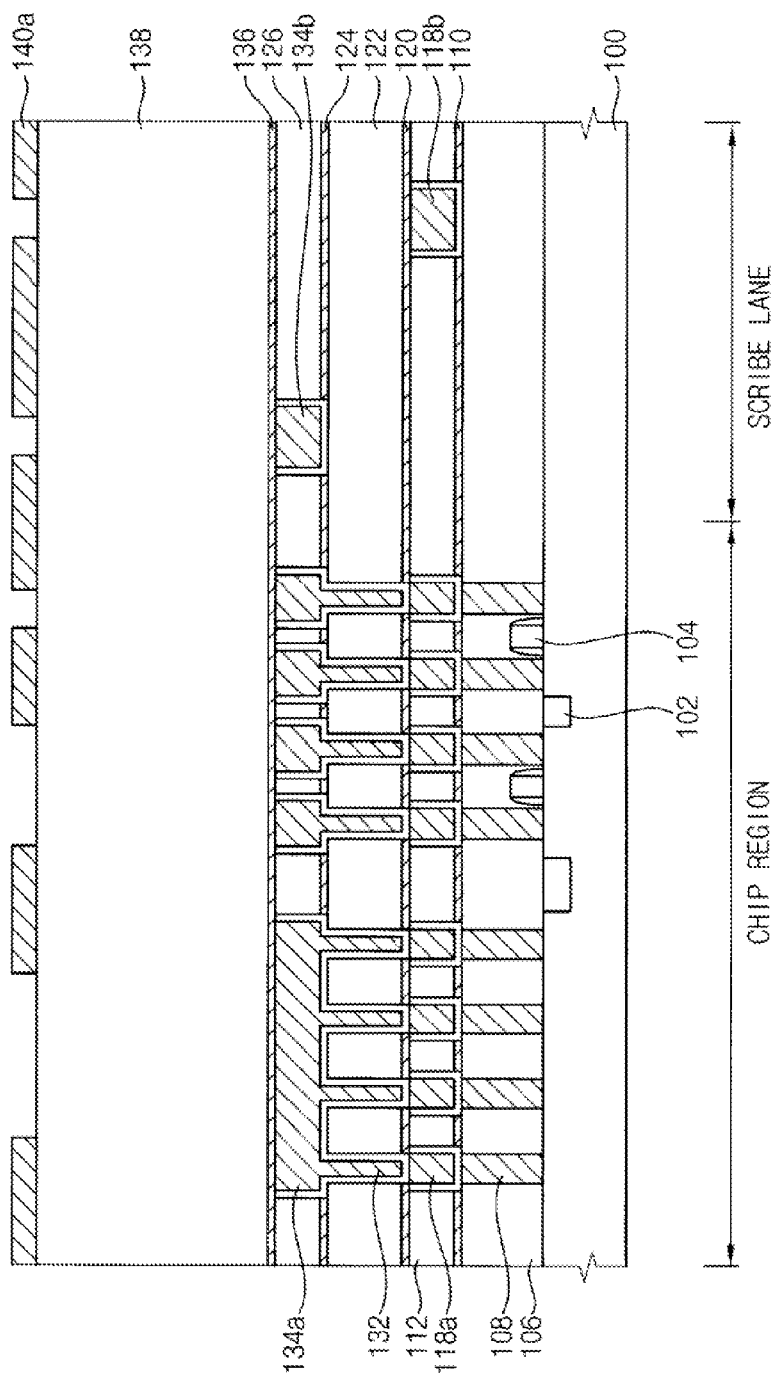

Referring to FIG. 10, the bottom anti-reflection coating layer 142 and the first hard mask layer 140 may be etched using the first photoresist pattern 144 as an etching mask. Then, the first photoresist pattern 144 and the bottom anti-reflection coating layer 142 may be removed. After completing the etching process, a first hard mask pattern 140a may be formed.

Figure 11:
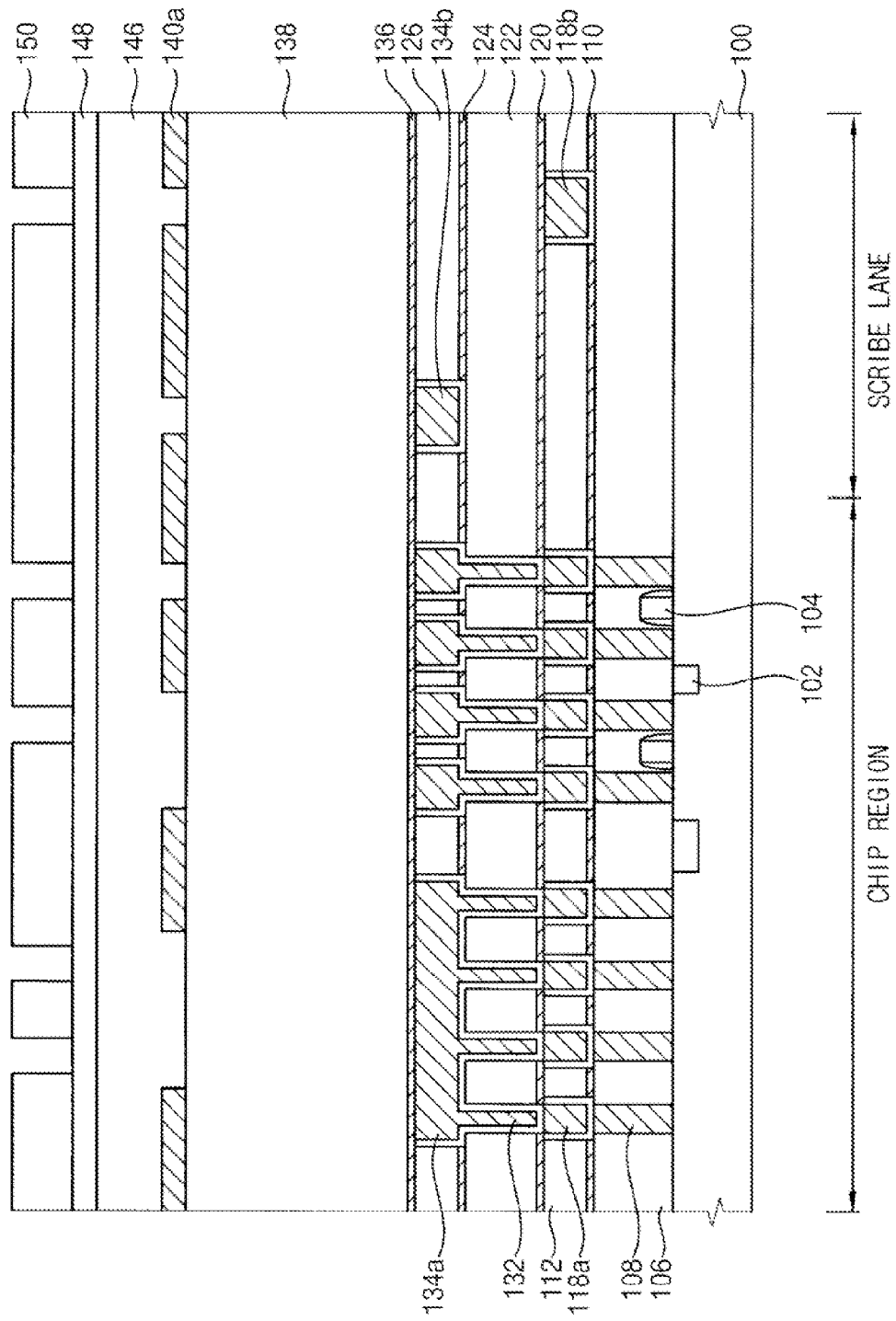

Referring to FIG. 11, a second hard mask layer 146 may be formed on the first hard mask pattern 140a and the fifth insulating interlayer 138. The second hard mask layer 146 may be formed by, for example, a spin coating process. In this case, an upper surface portion of the second hard mask layer 146 may have, for example, a planar shape.

On the second hard mask layer 146, an anti-reflective layer 148 may be formed. On the anti-reflective layer 148, a second photoresist pattern 150 may be formed. The second photoresist pattern 150 provided in the chip region may be formed to selectively expose a portion for forming a third contact hole. The second photoresist pattern 150 provided in the scribe lane may be formed to selectively expose a facing portion with respect to the second metal pattern 118b in the scribe lane.

Figure 12:
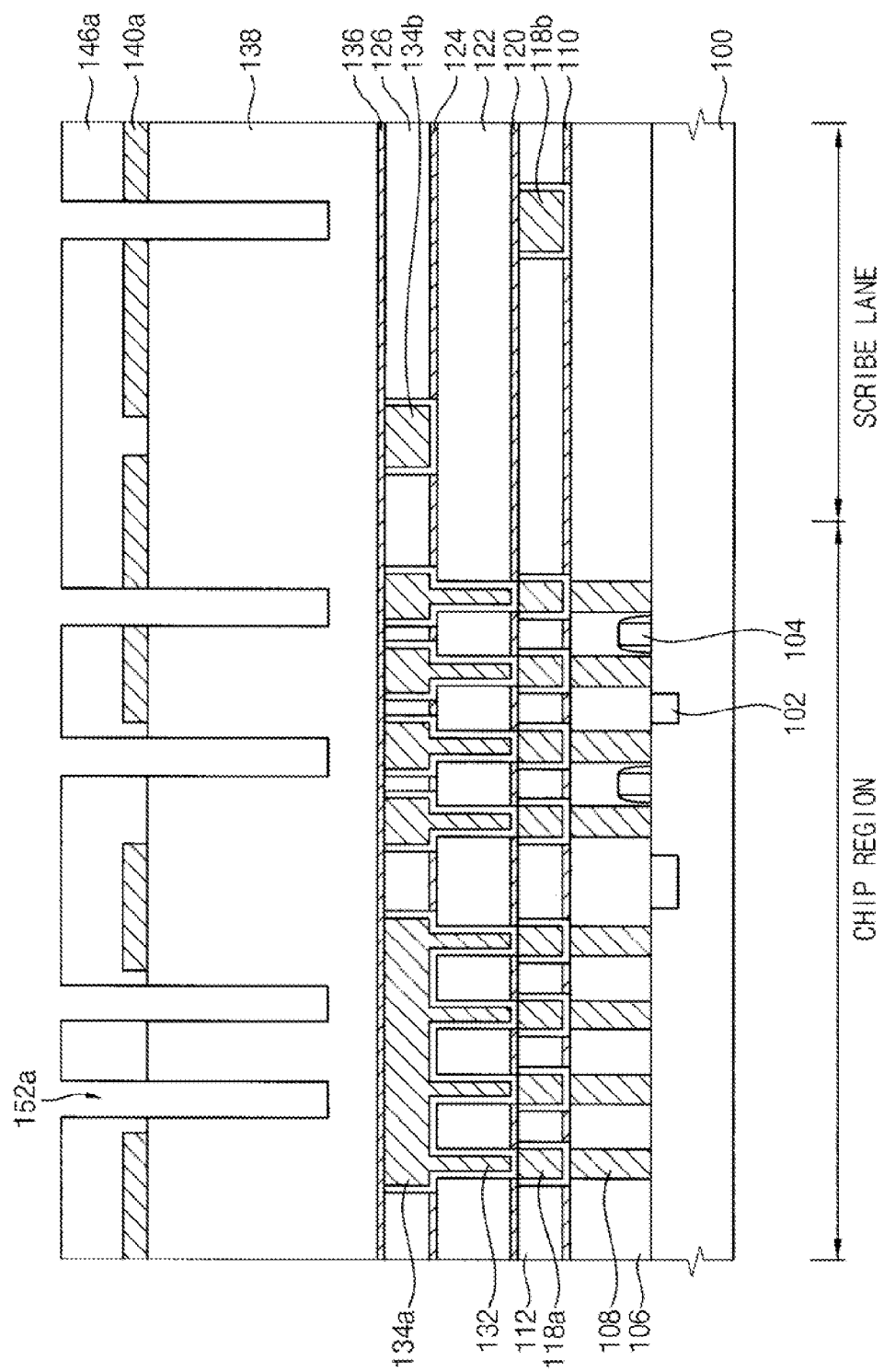

Referring to FIG. 12, the anti-reflective layer 148 and the second hard mask layer 146 may be etched using the second photoresist pattern 150 as an etching mask. A second hard mask pattern 146a may be obtained.

The fifth insulating interlayer 138 may be partially etched using, for example, the second hard mask pattern 146a as an etching mask to form partial contact holes 152a in the chip region and in the scribe lane. This etching process may be called a first etching process. The partial contact hole 152a in the chip region may be formed in a region for forming the third contact hole. In addition, the partial contact hole 152a in the scribe lane may be formed facing the second metal pattern 118b.

The fifth insulating interlayer 138 may be partially etched by, for example, the first etching process. Accordingly, the third etch stopping layer 136 may not be exposed through the bottom portion of the partial contact hole 152a. The partial contact hole 152a may be formed by etching the fifth insulating interlayer 138 to a specific target thickness smaller than the thickness of the fifth insulating interlayer 138.

When the fifth insulating interlayer 138 is over-etched when compared to the target thickness by the first etching process, a thickness from a bottom portion of the partial contact hole 152a to the third etch stopping layer 136 may be decreased. In this case, the surface characteristics of a bottom portion of the formed contact hole may be deteriorated. When the fifth insulating interlayer 138 is under-etched when compared to the target thickness by the first etching process, a thickness from a bottom portion of the partial contact hole 152a to the third etch stopping layer 136 may be increased. In this case, a not-opening defect may be generated at a bottom portion of the formed contact hole and the third and fourth metal patterns 134a and 134b may not be opened through the bottom portion of the contact holes. Accordingly, the fifth insulating interlayer 138 may be etched to a target thickness, which is smaller than the thickness of the fifth insulating interlayer 138 to form the partial contact hole 152a.

A thickness from the bottom portion of the partial contact hole 152a to the third etch stopping layer 136 after performing the first etching process may be smaller than a depth of a third trench 154c to be formed in a following process. In addition, a thickness from the bottom portion of the partial contact hole 152a to the third etch stopping layer 136 after performing the first etching process may be greater than half of a depth of a third trench 154c to be formed in a following process. The target thickness may be set considering the above described conditions. Further, the fifth insulating interlayer 138 may be etched accurately to the target thickness to form the partial contact hole 152a.

After completing the first etching process, the second hard mask pattern 146a may be removed. The second hard mask pattern 146a may be removed through, for example, an ashing process.

Figure 13:
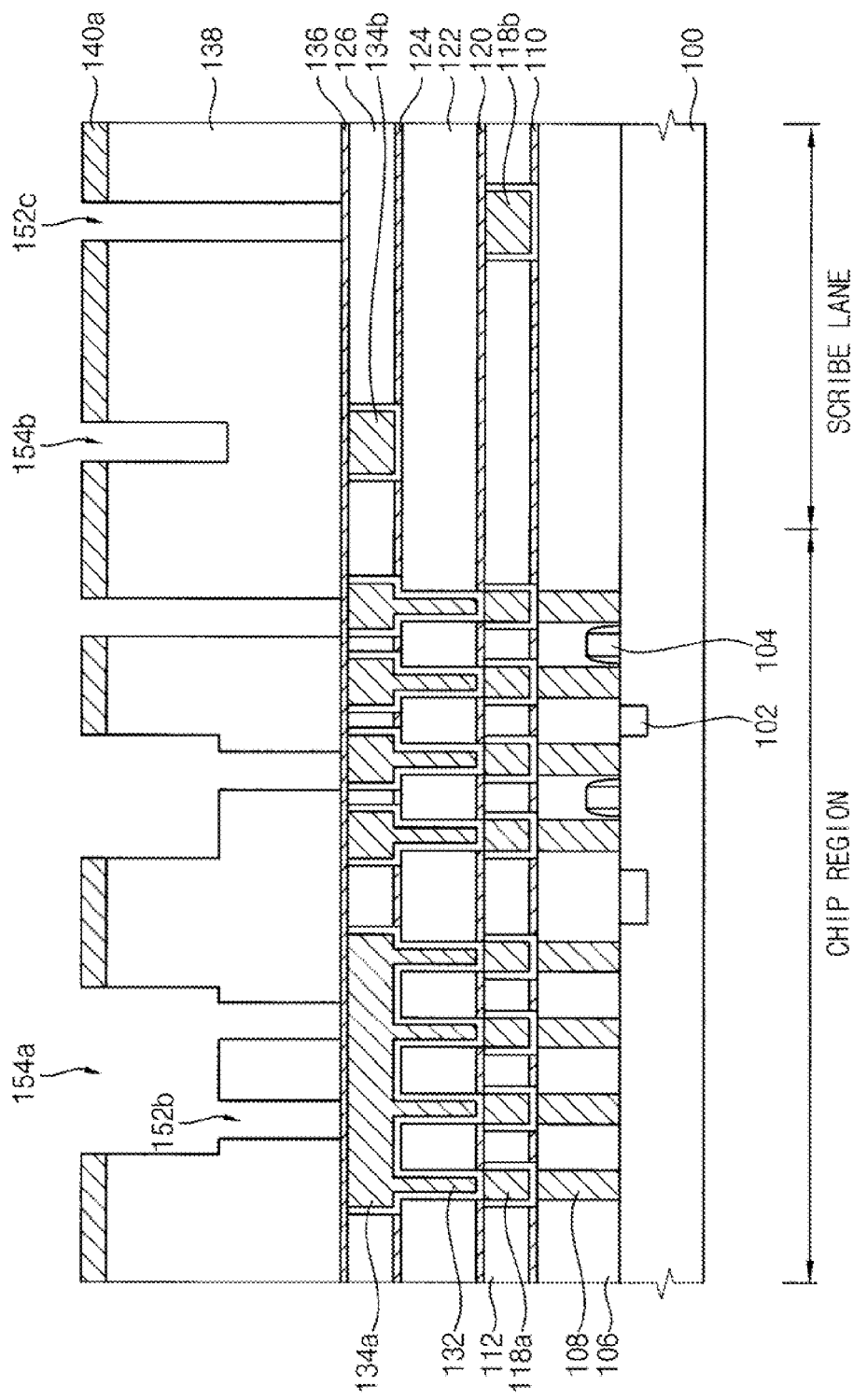

Referring to FIG. 13, the fifth insulating interlayer 138 may be partially etched using, for example, the first hard mask pattern 140a. This etching process may be called a second etching process. The second etching process may be the main etching process.

The fifth insulating interlayer 138 under the partial contact hole 152a in the chip region may be etched to form a preliminary third contact hole 152b through performing the second etching process. In addition, a preliminary third trench 154a connected to the preliminary third contact hole 152b may be formed in the chip region.

The fifth insulating interlayer 138 under the partial contact hole 152a may be etched to form a preliminary first opening portion 152c in the scribe lane. The third etch stopping layer 136 may be exposed through a bottom portion of the preliminary first opening portion 152c. In addition, a preliminary second opening portion 154b facing the fourth metal pattern 134b may be formed in the scribe lane.

Figure 14:
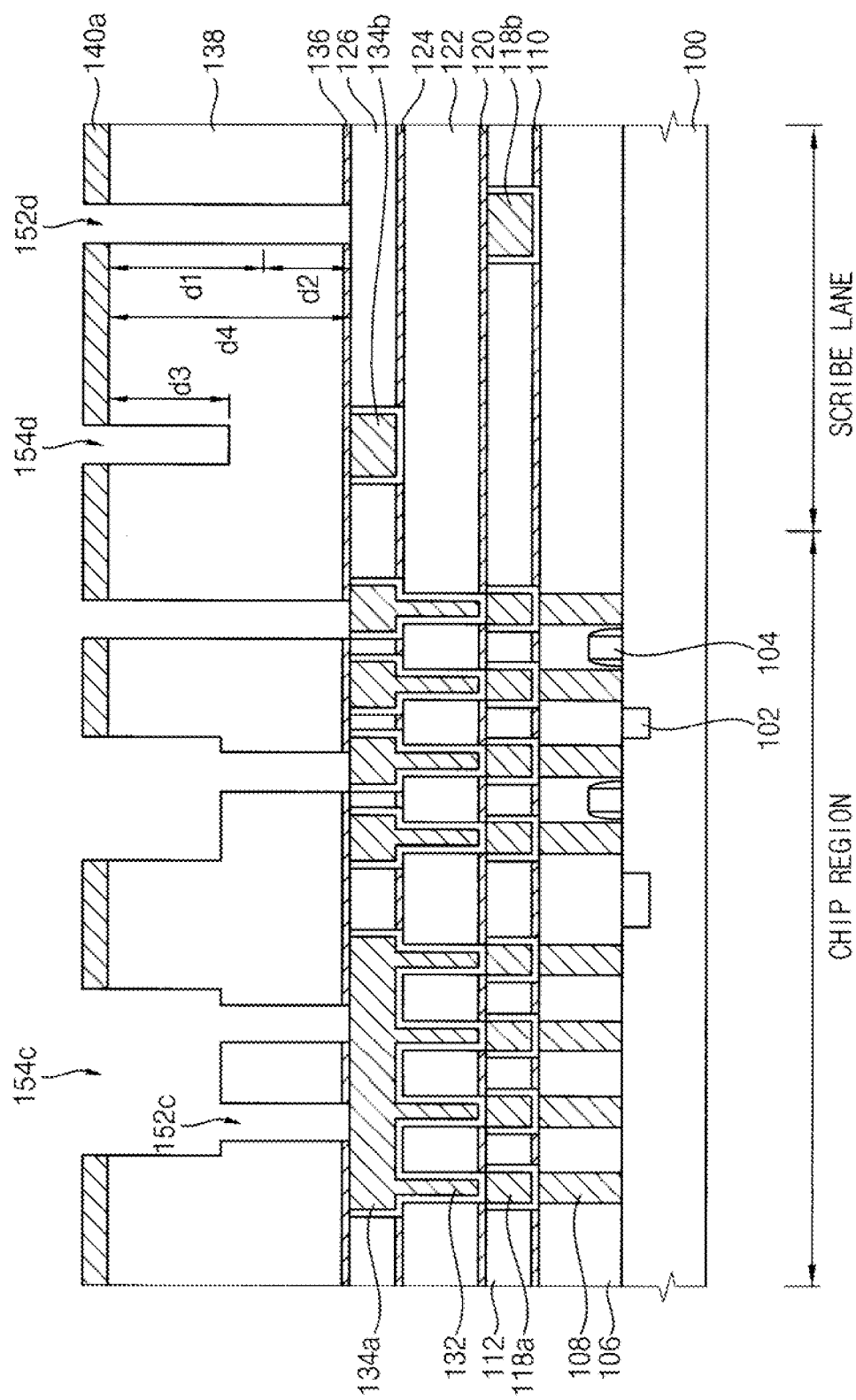

Referring to FIG. 14, the third etch stopping layer 136 exposed through the bottom portion of the preliminary third contact hole 152b and the preliminary first opening portion 152c may be etched using, for example, the first hard mask pattern 140a. This etching process may be called a third etching process.

The third etch stopping layer 136 may be etched and a third contact hole 152c exposing the third metal pattern 134a may be formed in the chip region by, for example, performing the third etching process. In addition, a third trench 154c making a connection with the third contact hole 152c may be formed in the chip region.

The third etch stopping layer 136 may be etched to form a first opening portion 152d in the scribe lane. However, the second metal pattern 118b provided under the first opening portion 152d may not be exposed in the scribe lane. In addition, the second opening portion 154d may be formed, for example, so as to face the fourth metal pattern 134b in the scribe lane.

The first, second and third etching processes may be performed, for example, in situ in one chamber.

After performing the etching processes, a third trench 154c and a third contact hole 152c for forming a metal wiring may be obtained in the chip region. In addition, a TEG for measuring a depth of the partial contact hole 152a illustrated in FIG. 12 may be formed in the scribe lane.

The depth of the partial contact hole 152a may be measured using the first and second opening portions 152d and 154d formed in the scribe lane.

For example, the depths of the first and second opening portions 152d and 154d formed in the scribe lane may be measured. The depths of the first and second opening portions 152d and 154d may be measured by, for example, an optical method.

The depth of the first opening portion 152d may be obtained by adding a first depth d1 of the partial contact hole formed by the first etching process and the second depth d2 of an etched layer formed through the second and third etching processes. The depth of the first opening portion 152d may be designated by a fourth depth d4.

The second opening portion 154d may be formed by, for example, performing the second and third etching processes. The depth of the second opening portion 154d may be the depth of the fifth insulating interlayer 138 etched by the second and third etching processes. The depth of the second opening portion 154d may be designated by a third depth d3.

The proportional relationship between the second depth d2 and the third depth d3 may be evaluated by data obtained by a plurality of experiments. The second depth d2 may be calculated by measuring the third depth d3.

A first depth d1 of the partial contact hole 152a may be obtained by subtracting the second depth d2 from the fourth depth d4 of the first opening portion 152d.

The obtained first depth d1 may be confirmed within a range of the target depth of the partial contact hole 152a. The following process should be performed only when the partial contact hole 152a is formed normally, to prevent a generation of a process defect.

Figure 15:
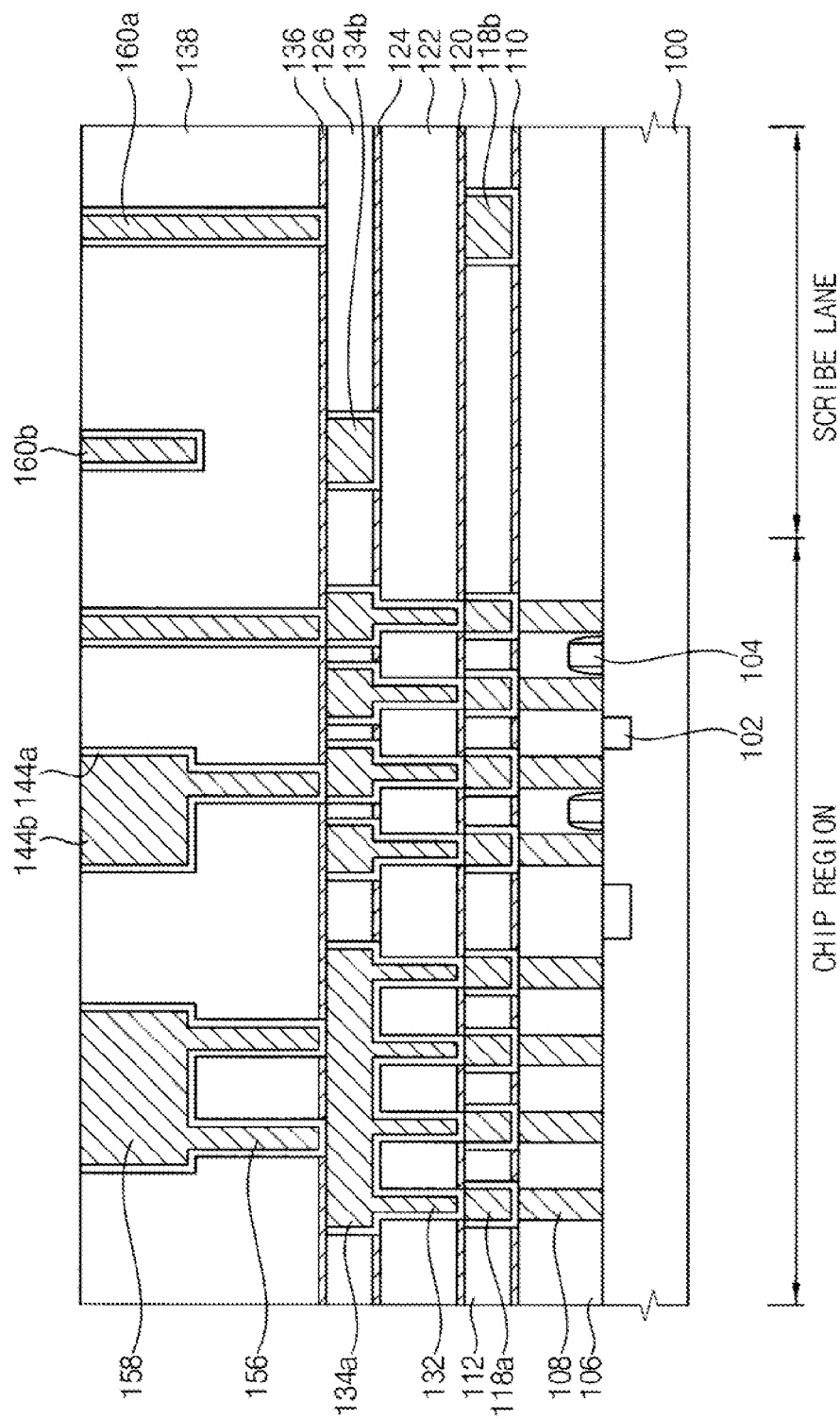

Referring to FIG. 15, a third barrier metal layer 144a may be formed on surface portions of the third trench 154c, the third contact hole 152c, the first and second opening portions 152d and 154d and the fifth insulating interlayer 138. A third metal layer 144b may be formed on the third barrier metal layer 144a. The third metal layer 144b may be formed by, for example, plating copper.

The third metal layer 144b and the third barrier metal layer 144a may be polished to expose the fifth insulating interlayer 138. Through the polishing process, a third contact plug 156 and a fifth metal pattern 158 may be formed in the chip region. In addition, a first pattern 160a and a second pattern 160b may be formed in the scribe lane.

Hereinafter, defects generated when the partial contact hole has been etched not to a normal depth but to an abnormal depth will be explained in detail.

Figure 16:
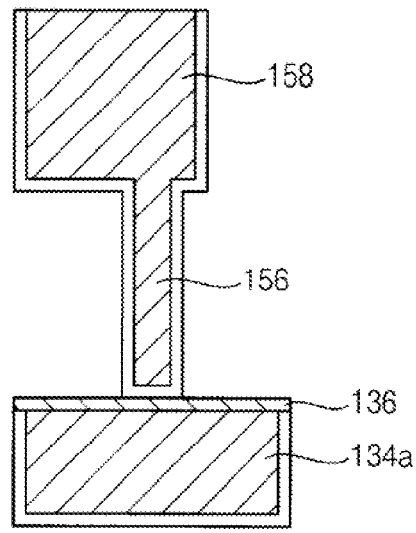

FIG. 16 is a cross-sectional view of a structure illustrating a partial contact hole undergoing an under-etching.

Referring to FIG. 16, as the partial contact hole may not be etched sufficiently to a desired depth, the upper surface portion of the third metal pattern 134a may not be exposed through the third contact hole after performing the second and third etching processes. Accordingly, a defect of dis-connecting the third metal pattern 134a and the third contact plug 156 may be generated.

Figure 17:
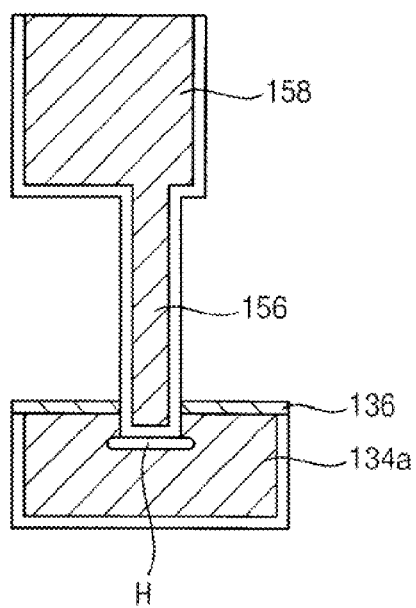

FIG. 17 is a cross-sectional view of another structure illustrating a partial contact hole undergoing an over-etching.

Referring to FIG. 17, when the partial contact hole has been over-etched, the upper surface portion of the third metal pattern 134a may be over-etched after performing the subsequent second and third etching processes. The upper surface portion of the third metal pattern 134a may be attacked to deteriorate an interface characteristic between the third metal pattern 134a and the third contact plug 156. Even though the interface characteristic between the third metal pattern 134a and the third contact plug 156 may not be sufficient, an electrical operation defect may not be generated. However, when the interface characteristic between the third metal pattern 134a and the third contact plug 156 is not sufficient, the reliability of the manufactured device may be deteriorated. When a current flows continuously through a metal wiring, a metal depletion defect may be generated at a bottom portion of the third contact plug containing defects by an electro-migration.

The above-described defects may be generated due to the abnormal formation of the partial first contact hole. The depth of the partial first contact hole may be measured using a TEG in accordance with example embodiments so a first partial contact hole having a desired depth may be formed. Accordingly, the generation of the above-described defects may be prevented in advance.

Figure 18:
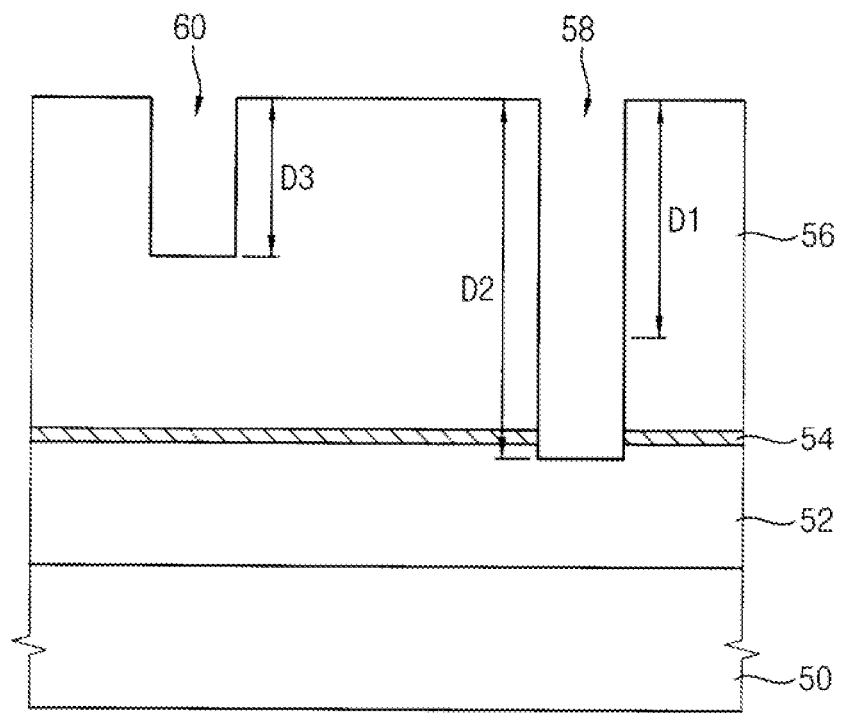

FIG. 18 is a cross-sectional view illustrating a monitoring TEG for an etching process in accordance with an example embodiment of the present inventive concept.

The monitoring TEG for the etching process of the present example embodiment of FIG. 18 may exclude a first metal pattern and a second metal pattern under a first opening portion and a second opening portion, respectively.

Referring to FIG. 18, a substrate 50 including, for example, a chip region and a scribe lane may be provided. The monitoring TEG in accordance with the present example embodiment may be provided in the scribe lane of the substrate 50.

A first insulating interlayer 52 may be formed on the substrate 50. A first etch stopping layer 54 may be formed on the first insulating interlayer 52. The first etch stopping layer 54 may include, for example, at least one material of SiCN, SiON and SiN.

A second insulating interlayer 56 may be provided on the first etch stopping layer 54. At the second insulating interlayer 56, a first opening portion 58 and a second opening portion 60 may be provided.

The first opening portion 58 may be formed by, for example, performing a first etching process for partially etching the second insulating interlayer 56, a second etching process that may be a main etching process and a third etching process for etching the first etch stopping layer 54 one by one.

The second insulating interlayer 56 may be etched to a thickness not exposing the first etch stopping layer 54 by the first etching process. The main etching process, e.g. the second etching process may be performed until the first etch stopping layer 54 may be exposed. Accordingly, the first opening portion 58 may extend from an upper surface portion of the second insulating interlayer 56 to an upper portion of the first insulating interlayer 52 under the first etch stopping layer 54. A bottom portion of the first opening portion 58 may be positioned in the first insulating interlayer 52.

The second opening portion 60 may be formed by, for example, performing the second and third etching processes. The first etching process may not be applied.

The first etch stopping layer 54 may not be exposed through the bottom portion of the second opening portion 60. The bottom portion of the second opening portion 60 may be positioned in the second insulating interlayer 54.

The depths of the first and second opening portions 58 and 60 may be measured by, for example, a physical method using a probe.

The TEG may be used for measuring a depth D1 of a partial contact hole formed by performing the first etching process. The depth D1 of the partial contact hole formed after performing the first etching process may be measured using a depth D2 of the first opening portion 58 and a depth D3 of the second opening portion 60.

The depth D1 of the partial contact hole may be the same as described in connection with FIG. 1. Since the TEG in the present example embodiment of FIG. 18 may not include metal patterns under the first and second opening portions 58 and 60, the depths of the first and second opening portions 58 and 60 may be measured by, for example, a physical method using a probe.

As described above, a partial contact hole having an accurate depth may be formed using a monitoring TEG in accordance with example embodiments. The generation of defects while forming a metal wiring may be decreased. A semiconductor device including a metal wiring may be manufactured using the monitoring TEG.

Having described example embodiments of the present inventive concept, it is further noted that it is readily apparent to those of reasonable skill in the art that various modifications can be made herein without departing from the spirit and scope of the invention as defined by the metes and bounds of the appended claims.

What is claimed is:

1. A method of manufacturing a semiconductor device comprising:
    forming an etch stopping layer and a target layer on a substrate including a chip region and a scribe lane;
    forming a first hard mask pattern on the target layer;
    forming a second hard mask pattern on the first hard mask pattern;
    performing a first partial etching process with respect to the target layer using the second hard mask pattern, to form partial contact holes in the chip region and in the scribe lane, respectively;
    performing a second etching process with respect to the target layer and a third etching process with respect to the etch stopping layer using the first hard mask pattern, to form a trench and a contact hole in the chip region and a first opening portion extending from the partial contact hole in the scribe lane and a second opening portion formed by etching the target layer near the partial contact hole in the scribe lane; and
    measuring a depth of the partial contact hole formed in the scribe lane by the first partial etching process using a difference between a depth of the first opening portion and a depth of the second opening portion.

2. The method of claim 1, wherein the measuring of the depth of the partial contact hole in the scribe lane comprises:
    measuring a first depth of the first opening portion;
    measuring a second depth of the second opening portion;
    calculating a third depth of an etched portion by the second etching process and the third etching process in the first opening portion by using the second depth of the second opening portion; and
    obtaining the depth of the partial contact hole formed by the first partial etching process using the first depth of the first opening portion and the third depth.

3. The method of claim 2, wherein the third depth is calculated from a proportional relationship between the second depth and the third depth, the proportional relationship being obtained through performing a plurality of experiments.

4. The method of claim 2, wherein the first depth and the second depth are measured by a physical method using a probe.

5. The method of claim 2, further comprising:
    forming a first metal pattern under the etch stopping layer, the first metal pattern facing a bottom portion of the first opening portion, the first metal pattern being separated apart from the bottom portion of the first opening portion; and
    forming a second metal pattern under the etch stopping layer, the second metal pattern facing a bottom portion of the second opening portion, the second metal pattern being separated apart from the bottom portion of the second opening portion.

6. The method of claim 5, wherein the measuring of the first depth comprises:
    measuring a first distance from the bottom portion of the first opening portion to the first metal pattern using a reflecting light from the first metal pattern under the first opening portion; and
    calculating the first depth using a thickness from an upper surface portion of the first metal pattern to an upper surface portion of the target layer and the first distance.

7. The method of claim 5, wherein the measuring of the second depth comprises:
    measuring a second distance from a bottom portion of the second opening portion to the second metal pattern using a reflecting light from the second metal pattern under the second opening portion; and
    calculating the second depth using a thickness from an upper surface portion of the second metal pattern to an upper surface portion of the target layer and the second distance.

8. The method of claim 1, wherein the first hard mask pattern exposes a portion of the target layer for forming a trench in the chip region and exposes portions of the target layer for forming the first and second opening portions in the scribe lane.

9. The method of claim 1, wherein the second hard mask pattern exposes a portion of the target layer for forming a contact hole in the chip region and exposes a portion of the target layer for forming the first opening portion in the scribe lane.

10. The method of claim 1, wherein the forming of the second hard mask pattern comprises:
    forming a second hard mask layer on the first hard mask pattern using a spin coating process;

forming an etching mask pattern on the second hard mask layer; and etching the second hard mask layer using the etching mask pattern to form the second hard mask pattern.

11. The method of claim 1, further comprising:

forming a metal layer in the trench and the contact hole in the chip region and in the first and second opening portions in the scribe lane; and polishing the metal layer to expose an upper surface portion of the target layer.

12. The method of claim 1, wherein the etch stopping layer includes at least one material selected from the group consisting of silicon carbon nitride (SiCN), silicon oxynitride (SiON) and silicon nitride (SiN).

13. The method of claim 1, wherein the target layer is an insulating interlayer.

14. A method of manufacturing a semiconductor device comprising:

forming a first insulating interlayer on a substrate including a chip region and a scribe lane;

forming a first etch stopping layer on the first insulating interlayer;

forming a second insulating interlayer on the first etch stopping layer;

forming a first opening portion in the second insulating interlayer in the scribe lane by performing a first etching process which partially etches the second insulating interlayer to form a partial contact hole in the scribe lane which does not expose the first etch stopping layer in the scribe lane, a second etching process which etches the second insulating interlayer until the etch stopping layer is exposed in the scribe lane and a third etching process which etches the first etch stopping layer exposed in the scribe lane;

forming a second opening portion in the second insulating layer near the first opening portion in the scribe lane by performing only the second and third etching processes and wherein the first etch stopping layer is not exposed by the second opening portion; and measuring a depth of the partial contact hole formed by the first etching process using a depth of the first opening portion and a depth of the second opening portion.

15. The method of claim 14, wherein the depths of the first and second opening portions are measured using a physical method using a probe.

16. A method of manufacturing a semiconductor device comprising:

forming a first insulating interlayer on a substrate including a chip region and a scribe lane;

forming a first metal pattern in the first insulating interlayer in the chip region and a second metal pattern in the first insulating interlayer in the scribe lane;

forming a second insulating interlayer on the first insulating interlayer;

forming a third insulating interlayer on the second insulating interlayer;

forming a third metal pattern in the third insulating interlayer in the chip region and a fourth metal pattern in the third insulating interlayer in the scribe lane;

forming a first etch stopping layer on the third insulating interlayer and a fourth insulating interlayer on the first etch stopping layer;

forming a first hard mask pattern on the fourth insulating interlayer and a second mask pattern on the first hard mask pattern;

performing a first etching process which includes etching the fourth insulating interlayer to form a partial contact hole in the chip region and in the scribe lane facing the second metal pattern formed in the scribe region using the second hard mask pattern, wherein the first etch stopping layer is not exposed by the partial contact holes in the chip region and the scribe lane;

performing a second etching process using the first hard mask pattern which includes etching the fourth insulating interlayer including a bottom portion of the partial contact hole in the chip region to form a preliminary first contact hole exposing the first etch stopping layer in the chip region and a preliminary first trench connected to the preliminary first contact hole in the chip region, and etching the fourth insulating interlayer including a bottom portion of the partial contact hole in the scribe lane and another portion of the fourth insulating interlayer near the partial contact hole in the scribe lane to respectively form a preliminary first opening portion in the scribe lane exposing the first etch stopping layer and a preliminary second opening portion in the scribe lane which does not expose the first etch stopping layer and which faces the fourth metal pattern formed in the scribe lane;

performing a third etching process using the first hard mask pattern which includes etching the fourth insulating interlayer and the first etch stopping layer exposed by the preliminary first contact hole to form a first contact hole in the chip region exposing the third metal pattern and a first trench connected with the first contact hole, etching a portion of the first etch stopping layer exposed by the preliminary first opening portion in the scribe lane to form a first opening portion in the scribe lane and etching the fourth insulating interlayer at a bottom of the preliminary second opening portion in the scribe lane to form a second opening portion in the scribe lane having a depth less a depth of the fourth insulating interlayer and less than a depth of the first opening portion; and measuring a depth of the partial contact hole formed in the scribe lane by the first etching process using a difference between the depth of the first opening portion and the depth of the second opening portion formed in the scribe lane.

17. The method of claim 16, wherein the first metal pattern is located in a second trench formed in first insulating interlayer in the chip region and the second metal pattern is located in a third trench formed in the first insulating interlayer in the scribe lane, and wherein the first metal pattern and the second metal pattern each include a first barrier metal layer composed of one of titanium or titanium nitride formed along a sidewall and a bottom portion of the second and third trenches, respectively, and a first metal layer including copper formed on the first barrier metal layer.

18. The method of claim 16, wherein the forming of the third and fourth metal patterns includes partially etching the third insulating interlayer to form a fourth trench in the third insulating interlayer in the chip region and a fifth trench in the third insulating interlayer in the scribe lane and wherein the fifth trench does not face the second metal pattern formed in the scribe lane;

partially etching the second insulating interlayer under a bottom portion of the fourth trench in the chip region to form a second contact hole exposing a surface of the first metal pattern in the chip region, forming a second barrier metal layer along a sidewall and a bottom portion of the fourth trench and a surface portion of the second contact hole as well as along a sidewall and a bottom portion of the fifth trench; and forming a second metal layer in the fourth and fifth trenches and on the second metal layer; and polishing the second metal layer and the second barrier metal layer to expose the third insulating interlayer to thereby form the third metal pattern and the fourth metal pattern in the fourth and fifth trenches respectively and a first contact plug in the second contact hole in the chip region.

19. The method of claim 18, further comprising forming a third barrier metal layer on surface portions of the first trench, the first contact hole, the first and second opening portions and the fourth insulating interlayer;

forming a third metal layer including copper on the third barrier metal layer; and polishing the third metal layer and the third barrier metal layer to expose the fourth insulating interlayer to thereby form a second contact plug and a fifth metal pattern on the chip region and a first pattern and a second pattern in the scribe lane.

20. The method of claim 16, wherein the first etching process, the second etching process and the third etching process are performed in situ in one chamber.

* * * * *